United States Patent [19]

Kohyama et al.

[11] Patent Number: 5,142,639

[45] Date of Patent: Aug. 25, 1992

[54] SEMICONDUCTOR MEMORY DEVICE HAVING A STACKED CAPACITOR CELL STRUCTURE

[75] Inventors: Yusuke Kohyama, Kawasaki; Shizuo Sawada, Yokohama, both of Japan; Toshiharu Watanabe, Mountain View, Calif.; Kinuyo Kohyama, Kawasaki, Japan

[73] Assignee: Kabushiki Kaisha Toshiba, Kawasaki, Japan

[21] Appl. No.: 701,884

[22] Filed: May 17, 1991

[30] Foreign Application Priority Data

May 18, 1990 [JP] Japan .................. 2-130051

[51] Int. Cl.[5] .................. H01L 29/68; H01L 27/02; H01L 29/34
[52] U.S. Cl. .................. 357/23.6; 357/41; 357/54
[58] Field of Search .................. 357/23.6, 41, 54

[56] References Cited
U.S. PATENT DOCUMENTS 4,953,126 8/1990 Ema .................. 357/41
5,021,357 6/1991 Taguchi et al. .................. 437/51

Primary Examiner—Rolf Hille
Assistant Examiner—Robert Limanek
Attorney, Agent, or Firm—Banner, Birch, McKie & Beckett

[57] ABSTRACT

In a stacked capacitor cell structure of a semiconductor memory device, the MIM (metal-insulator-metal) capacitor to be used as a transfer gate comprises at least a unit stack of a first insulation film, a lower capacitor electrode, a capacitor gate insulation film, an upper capacitor electrode, another capacitor gate insulation film and an extension of the lower capacitor electrode. Thus, the surface area of the lower capacitor electrode can be enlarged without increasing the plane area exclusively occupied by memory cells. Moreover, with such a configuration, since the surface area of the lower capacitor electrode can be augmented without increasing the film thickness of the electrode, the technical difficulties that the currently known methods of manufacturing semiconductor memory devices with a stacked capacitor cell structure encounter are effectively eliminated and consequently troubles such as short-circuited lower capacitor electrodes become nonexistent.

17 Claims, 10 Drawing Sheets

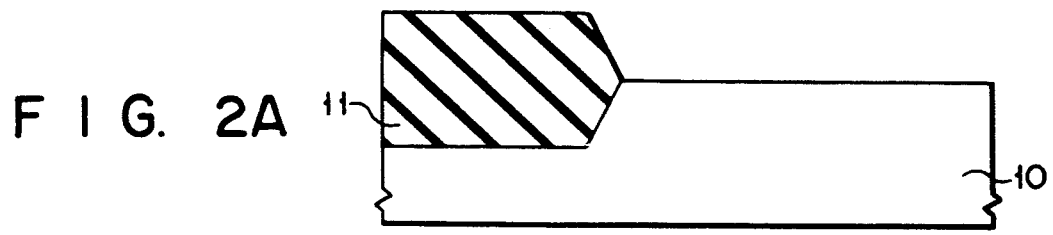
F I G. 2A
F I G. 2B

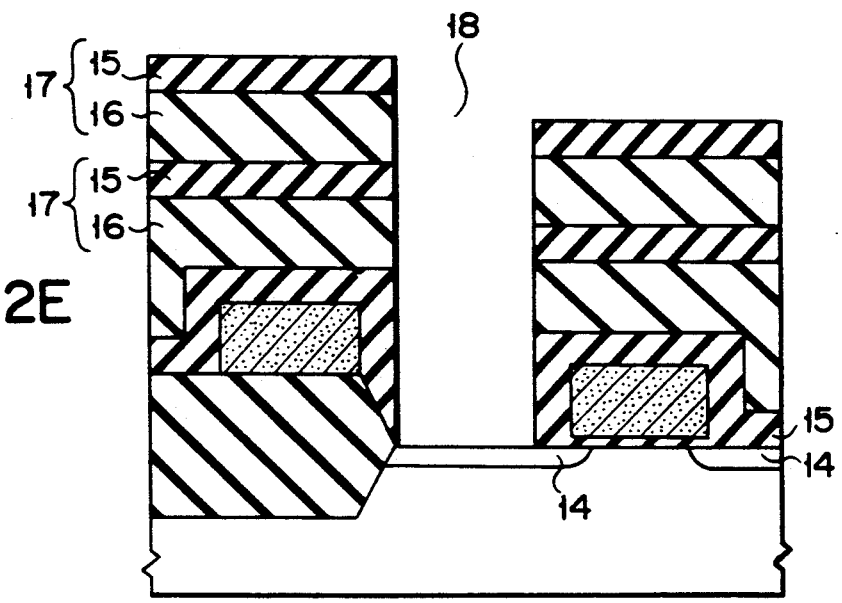
F I G. 2E
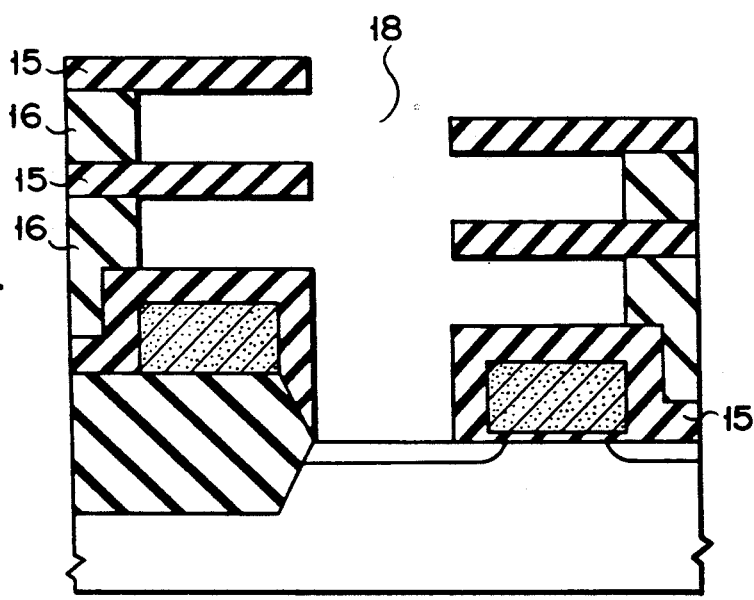
F I G. 2F

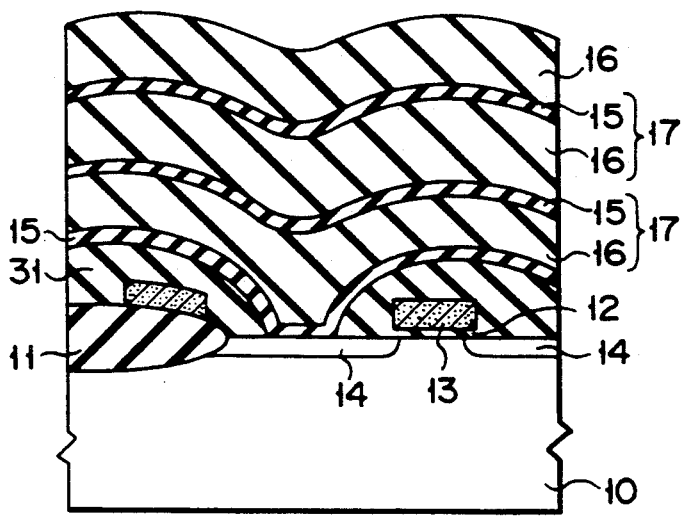
F I G. 4A
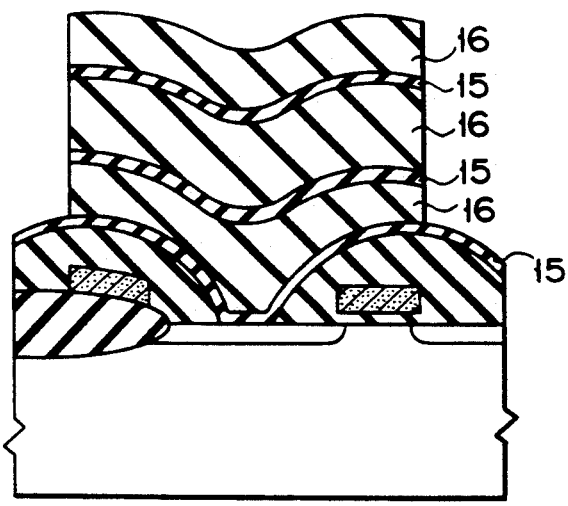
F I G. 4B
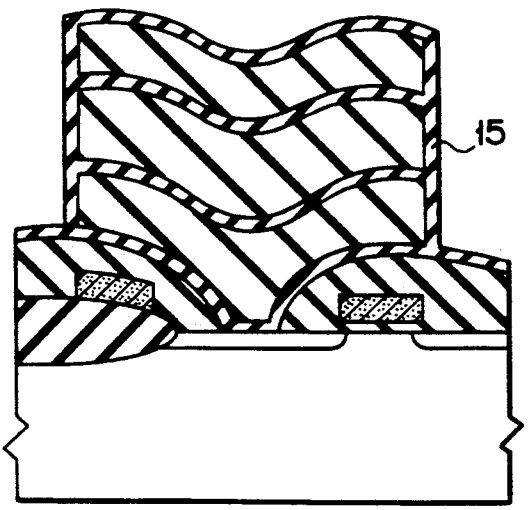
F I G. 4C

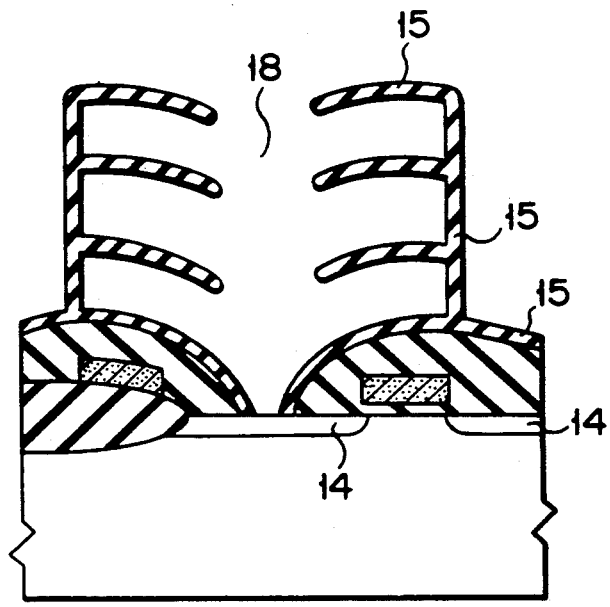
F I G. 4D
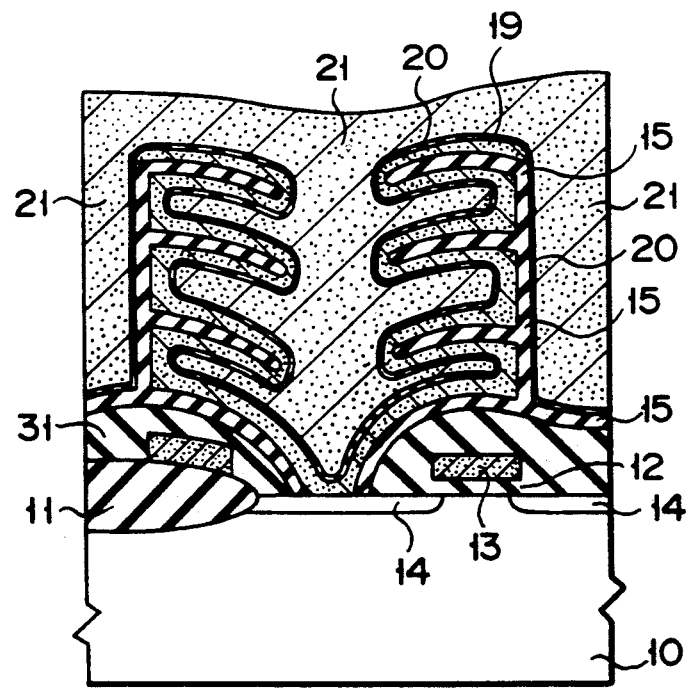
F I G. 4E

SEMICONDUCTOR MEMORY DEVICE HAVING A STACKED CAPACITOR CELL STRUCTURE

BACKGROUND OF THE INVENTION

1. Field of the Invention

This invention relates to a semiconductor memory device and a method of manufacturing the same and, more particularly, it relates to a semiconductor memory device having a stacked capacitor cell structure and a method of manufacturing the same.

2. Description of the Related Art

As the dynamic random access memory (DRAM) proceeds the way of development for large scale integration, the area allowed for its capacitor to occupy in the device is diminished, bringing forth serious problems such as erroneous data retrievals, destruction of stored data by radiation, etc.

There have been made proposals to solve these problems by producing capacitors with improved structures. One such improvement is the stacked capacitor cell structure. FIG. 1 illustrates a typical known configuration of the stacked capacitor cell structure. In FIG. 1, reference numeral 50 denotes a semiconductor substrate, 51 a field oxide selectively formed on the substrate surface for device isolation, 52 a gate oxide formed on the substrate surface, 53 a gate electrode (word line) of a MOS transistor to be used as a transfer gate and 54 source/drain diffusion layers of said MOS transistor. The surface of the MOS transistor formed on the semiconductor substrate is covered with an interlayer insulation film 55, through which a contact hole is bored, a lower capacitor electrode (storage node electrode) 56 being formed in such a manner that they are kept in touch with either of the source/diffusion layers 54 through the contact hole, an upper capacitor electrode (cell plate electrode) 58 being formed on said lower capacitor electrode 56 with the interposition of a capacitor gate insuation film 57, so that there is provided a MIM (metal-insulator-metal) capacitor for storing electric charges constituted by the lower capacitor electrode 56, the capacitor gate insulation film 57 and the upper capacitor electrode 58.

A stacked capacitor cell structure as described above can provide a sufficiently large area for a capacitor by enlarging the surface area of the lower capacitor electrode 56 without increasing the plane area exclusively occupied by memory cells.

However, such a conventional stacked capacitor cell structure is inevitably accompanied by a problem to be described below, if a higher level of integration is called for.

In order to provide a sufficiently large capacity for the capacitor by enlarging the surface area of the lower capacitor electrode 56, its lateral sides should carry a film at least as thick as 3,000 Å for their effective use. It is extremely difficult to finely work a lower capacitor electrode having such a film thickness and consequently adjacently located lower capacitor electrodes can be mutually short-circuited when they are worked.

Thus, any known methods of manufacturing a semiconductor memory device having a stacked capacitor cell structure is accompanied by the drawback as described above of forming thick films for the lower capacitor electrode that defy fine processes to be applied to them and can result in short-circuited lower capacitor electrodes and other similar troubles.

In view of the above described problem, it is, therefore, the object of the present invention to provide a semiconductor memory device having a stacked capacitor cell structure suitable for large scale integration and capable of providing a satisfactorily large memory capacity by arranging a lower capacitor electrode with such a sufficiently large surface area that eliminates any risk of short-circuiting to arise between adjacently located lower capacitor electrodes as well as a method of manufacturing the same.

SUMMARY OF THE INVENTION

According to the present invention, the above object of the invention is achieved by providing a semiconductor memory device of stacked capacitor cell structure comprising a MOS transistor formed on a semiconductor substrate as a transfer gate and a MIM capacitor for storing electric charges constituted by a lower capacitor electrode connected to either of the source/drain diffusion layers of the MOS transistor and an upper capacitor electrode formed on the lower capacitor electrode with the interposition of a capacitor gate insulation film, wherein the MIM capacitor comprises at least a unit stack of a first insulation film, a lower capacitor electrode, a capacitor gate insulation film, an upper capacitor electrode, another capacitor gate insulation film and an extension of the lower capacitor electrode.

With a stacked capacitor cell structure of a semiconductor memory device having a configuration as described above, since the MIM capacitor to be used as a transfer gate comprises at least a unit stack of a first insulation film, a lower capacitor electrode, a capacitor gate insulation film, an upper capacitor electrode, another capacitor gate insulation film and an extension of the lower capacitor electrode, the surface area of the lower capacitor electrode can be enlarged without increasing the plane area exclusively occupied by memory cells. Moreover, with such a configuration, since the surface area of the lower capacitor electrode can be augmented without increasing the film thickness of the electrode, the technical difficulties that the currently known methods of manufacturing semiconductor memory devices with a stacked capacitor cell structure encounter are effectively eliminated and consequently troubles such as short-circuited lower capacitor electrodes become non-existent.

Now, the present invention will be described in greater detail by referring to the accompanying drawings that illustrate preferred embodiments of the invention.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A through 2H show different steps of manufacturing and in section a first embodiment of the stacked capacitor cell structure of a DRAM according to the invention;

FIGS. 4A through 4E show different steps of manufacturing and in section a third embodiment of the stacked capacitor cell structure of a DRAM according to the invention.

DETAILED DESCRIPTION OF THE PREFERRED EMBODIMENTS

Figure 1:
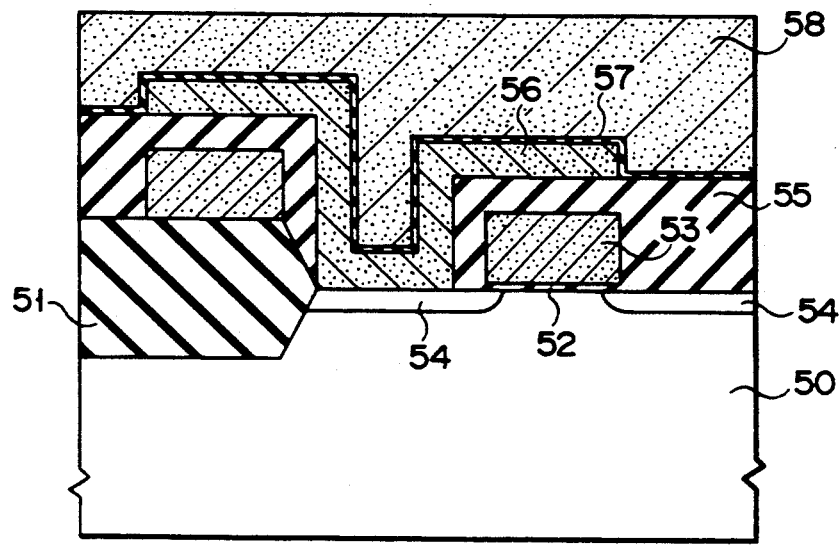
FIG. 1 is a sectional view of a known stacked capacitor cell structure.
Figure 2C:
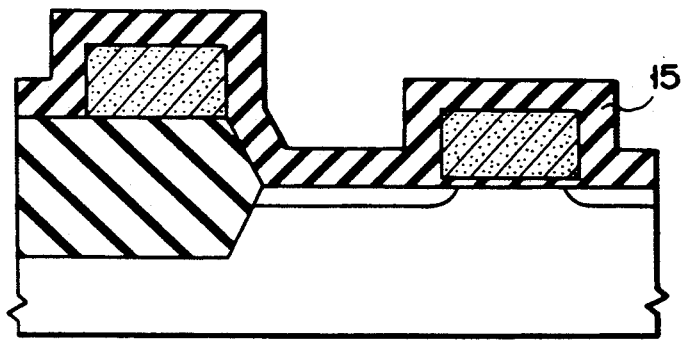
Figure 2D:
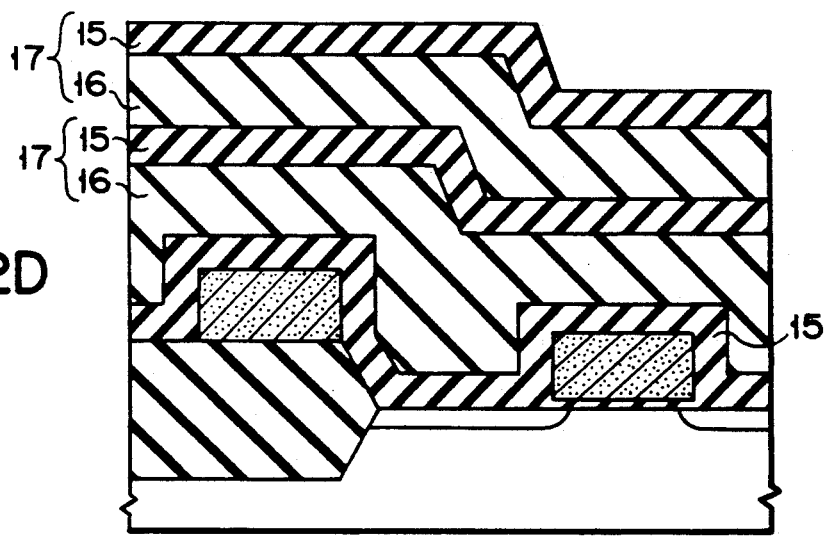
Figure 2G:
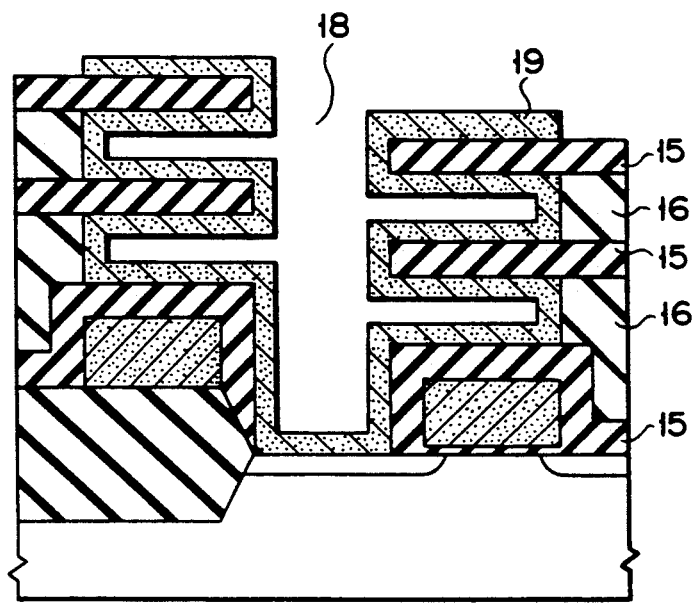
Figure 2H:
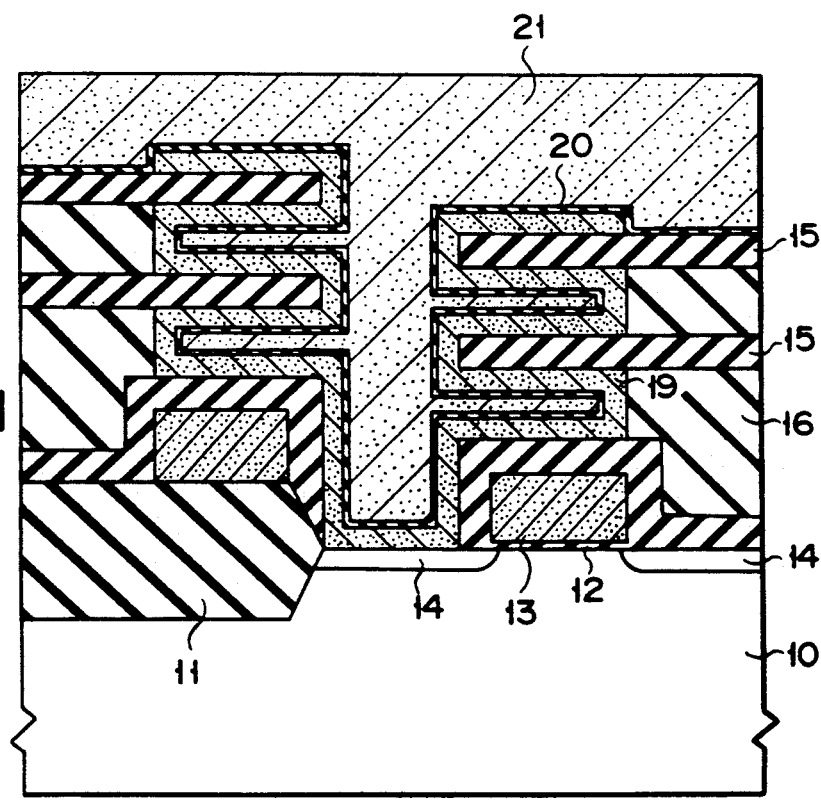

As best seen from FIG. 2H showing in section a first embodiment of the stacked capacitor cell structure of a DRAM according to the invention, it is different from a conventional stacked capacitor cell structure as shown in FIG. 1 and described earlier only in the configuration of the MIM capacitor, while the rest is identical with its counterpart of the known structure. In other words, the MIM capacitor of FIG. 2H comprises at least a unit stack (actually two unit stacks) of a first insulation film 15, a lower capacitor electrode 19, a capacitor gate insulation film 20, an upper capacitor electrode 21, another capacitor gate insulation film 20 and an extension of the lower capacitor electrode 19.

Now the process of producing such a stacked capacitor cell structure will be described by referring to FIGS. 2A through 2H.

As shown in FIG. 2A, a film of field oxide 11 for device isolation is selectively formed on the surface of a P-type silicon substrate 10 by using a known technique. Then, as shown in FIG. 2B, a film of gate oxide 12 is formed on the surface of the substrate and a gate electrode (word line) 13 is formed on the gate oxide film 12 for a MOS transistor to be used as a transfer gate. Thereafter, source/drain diffusion layers 14 are selectively formed on the surface of the substrate.

Then, inter-layer insulation films are formed on the MOS transistor. This formation of insulation films is done by first depositing a first insulation film 15 (e.g., a silicon nitride film) as shown in FIG. 2C. Then, as shown in FIG. 2D, a second insulation film (e.g., a silicon oxide film, a boron-phophorus-silicate-glass (BPSG) film or a phosphorus-silicate-glass (PSG) film) 16 on the entire surface of the substrate. Thereafter, another first insulation film 15 is deposited to form a two-layered film 17 comprising a first upper insulation film layer 15 and a second lower insulation film layer 16. It should be noted that at least a two-layered film 17 (two two-layered films in this embodiment) is formed on a first insulation film 15.

Thereafter, as seen from FIG. 2E, a contact hole 18 for lower capacitor electrodes (storage node electrodes) is bored through the two-layered films 17 and the first insulation film 15 on either of the source/drain diffusion layers 14 of the MOS transistor.

Then, as seen from FIG. 2F, only the second insulation film layers 16 are partly removed from the periphery of said contact hole 18 to form recesses by using an etching agent such as HF that reacts only with the material of the second insulation film layer. Since the first insulation films 15 are not affected by the agent, the contact hole 18 will come to show a fin-shaped jaggy profile.

Then, as shown in FIG. 2G, a layer of polysilicon is formed on the substrate carrying film layers thereon to completely cover the substrate so that the polysilicon comes to directly contact with either of the source/drain diffusion layers 14 of the MOS transistor under the contact hole 18. It should be noted that the polysilicon layer is also formed on the surfaces of the first insulation films 15 that have been exposed to the contact hole 18 or that the inner surface of the contact hole 18 is coated with a fin-shaped jagged polysilicon layer. A lower capacitor electrode 19 is obtained by patterning said polysilicon film layer.

Thereafter, another polysilicon film layer is formed on the lower capacitor electrode 19 with the interposition of a capacitor gate insulation film 20 to provide a upper capacitor electrode (cell plate electrode) 21 to complete a stacked capacitor cell structure as illustrated in FIG. 2H. Note that the capacitor gate insulation film 20 is also formed on the fin-shaped portion of the polysilicon layer (or the lower capacitor electrode 19) along the inner peripheral of the contact hole 18 and that any remaining vacant area of the contact hole 18 is filled with polysilicon to form the upper capacitor electrode 21.

It may be now understood that the above described first embodiment of the invention of the MIM capacitor of a stacked capacitor cell structure comprises at least a unit stack (actually two unit stacks) of a first insulation film, a lower capacitor electrode, a capacitor gate insulation film, an upper capacitor electrode, another capacitor gate insulation film and an extension of the lower capacitor electrode. Therefore, the surface area of the lower capacitor electrode can be enlarged without increasing the plane area exclusively occupied by memory cells as compared with the surface area of a known MIM capacitor with a stacked capacitor cell structure. Moreover, with such a configuration, since the surface area of the lower capacitor electrode can be augmented without increasing the film thickness of the electrode, the technical difficulties that the currently known methods of manufacturing semiconductor memory devices with a stacked capacitor cell structure encounter are effectively eliminated and consequently troubles such as short-circuited lower capacitor electrodes become nonexistent.

Figure 3A:
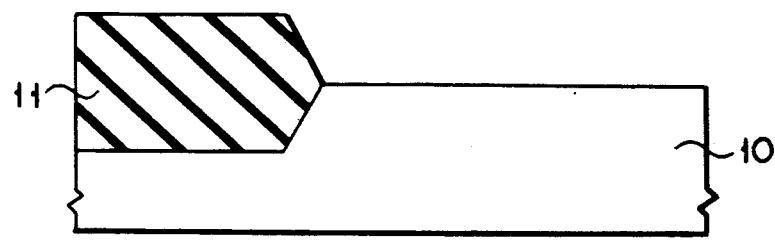
FIGS. 3A through 3H show different steps of manufacturing and in section a second embodiment of the stacked capacitor cell structure of a DRAM according to the invention.
Figure 3B:
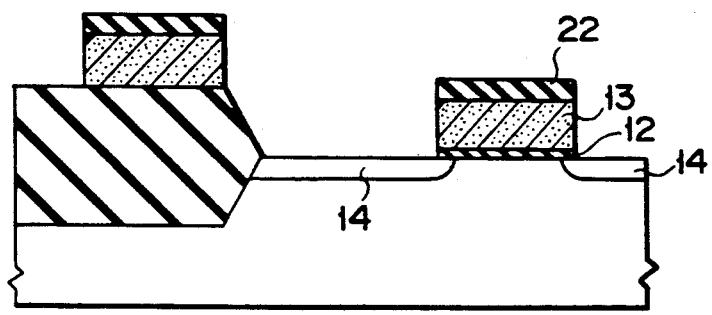
Figure 3C:
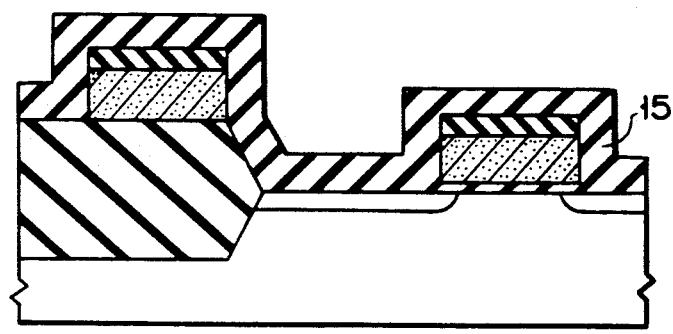
Figure 3D:
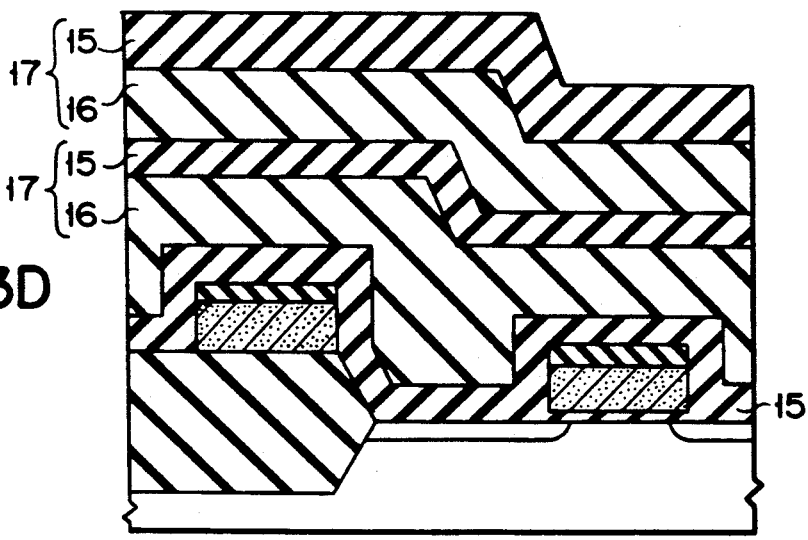
Figure 3E:
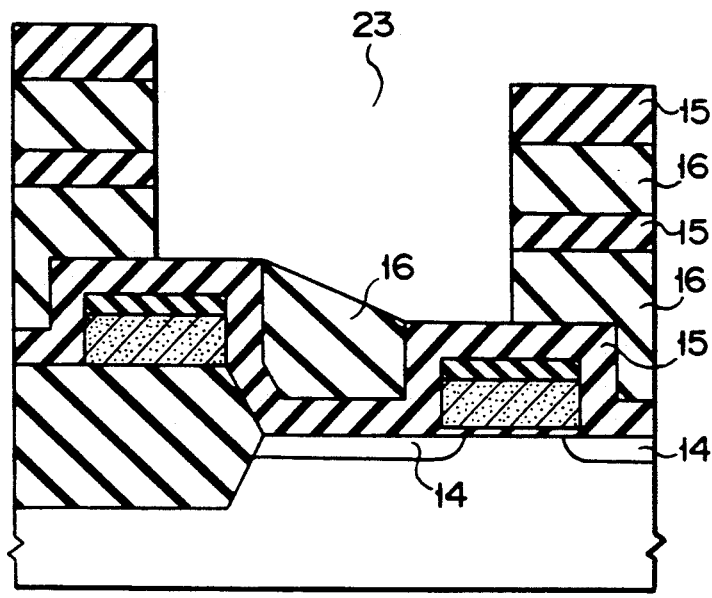
Figure 3F:
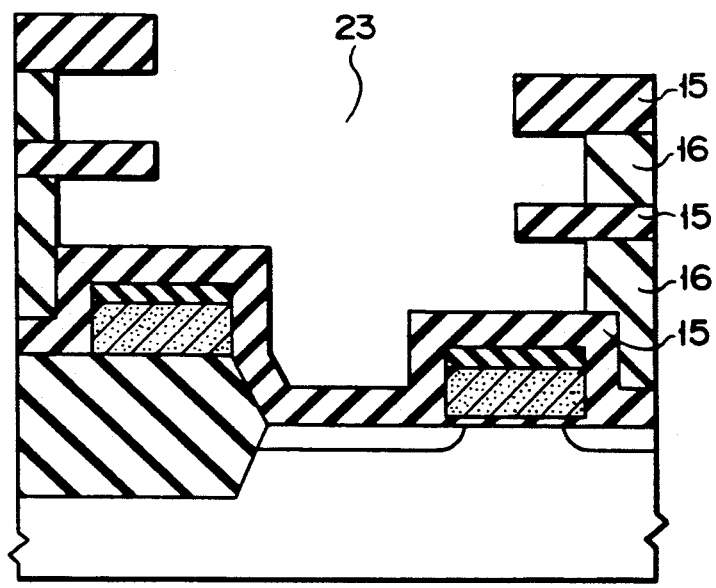
Figure 3G:
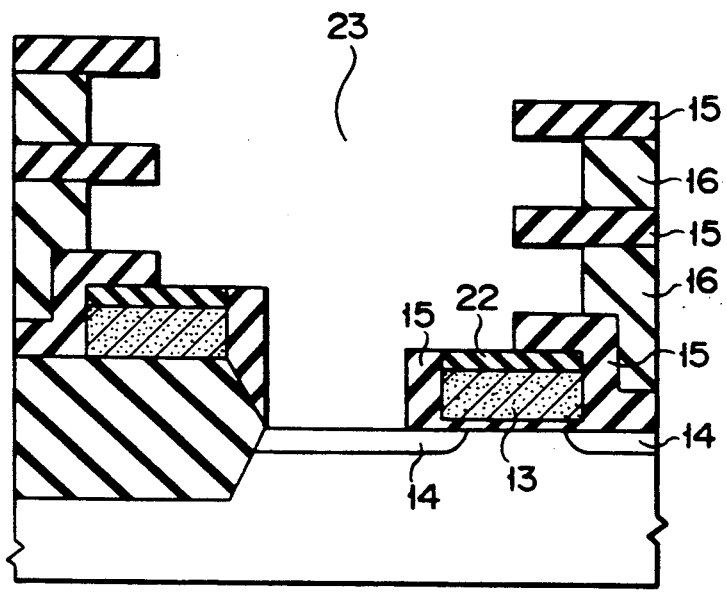
Figure 3H:
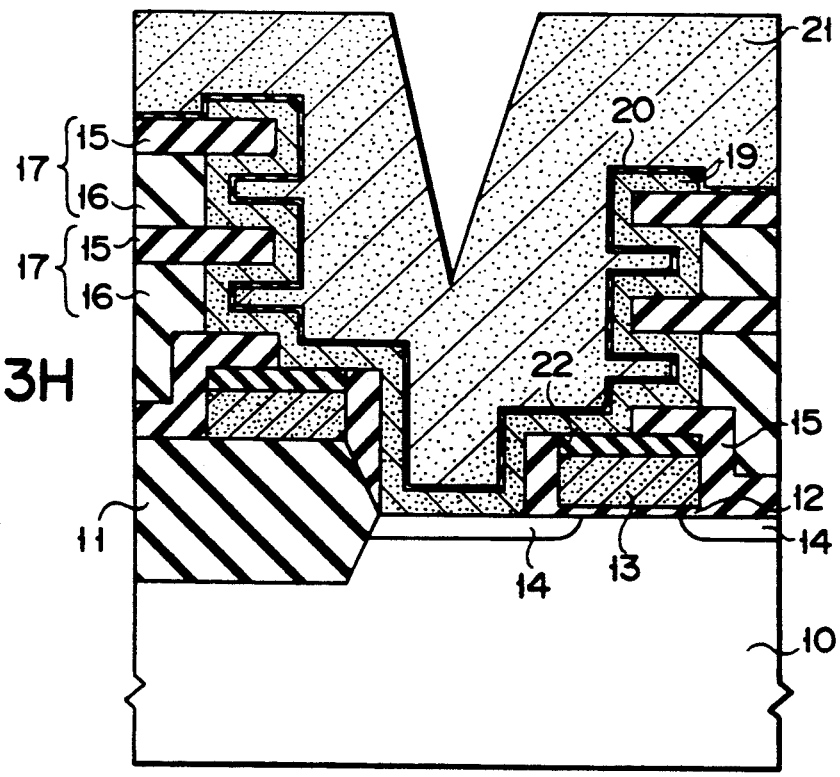

FIG. 3H schematically shows a cross section of a second embodiment of the stacked capacitor cell structure of a DRAM according to the invention. This embodiment is different from the first embodiment of FIG. 2H only in that a third insulation film 22 of, for instance, silicon oxide, is formed on the gate electrode 13 and that the jagged portion of the lower capacitor electrode 19 is found right above the gate electrode 13 of the MOS transistor. All the remaining parts of this embodiment are similar to those of the first embodiment and therefore indicated by same reference numerals as those of FIG. 2H.

Now, the process of producing such a stacked capacitor cell structure will be described by referring to FIGS. 3A through 3H.

As may be easily understood from FIGS. 3A and 3B, the steps to be followed to form a MOS transistor are identical with those of the first embodiment.

The third insulation film 22 of, for instance, silicon oxide is formed on the gate electrode 13 of the MOS transistor typically by means of a technique named CVD (chemical vapor deposition).

Then, as seen from FIGS. 3C and 3D and as in the case of the first embodiment, a first insulation film 15 is formed on the MOS transistor and at least a two-layered film (actually two films) 17 comprising a first insulation film layer 15 and a second insulation film layer 16 is formed on the first insulation film 15. The uppermost first insulation film layer 15 preferably has a thickness greater than that of the lowermost first insulation film 15, although the former may well have a thickness equal to or smaller than that of the latter.

Then, as shown in FIG. 3E, a vertical contact hole 23 is bored through the stack of films substantially to the upper surface of the lowermost first insulation film 15 right above either of the source/drain diffusion layers 14 of the MOS transistor by using an appropriate technique such as RIE (reactive ion etching).

Thereafter, as shown in FIG. 3F, only the second insulation film layer 16 is removed from the bottom of the contact hole 23 and, at the same time, the second insulation film layers 16 are partly removed from the periphery of the contact hole 23 to form recesses by using an etching agent such as HF that reacts only with the material of the second insulation film layer. Since the first insulation films 15 are not affected by the agent, the contact hole 18 will come to show a fin-shaped jaggy profile.

Then, all the area of the upper surface of the substrate is etched by means of an appropriate etching technique such as RIE and, as shown in FIG. 3G, either of the source/drain diffusion layers 14 of the MOS transistor and the third insulation film 22 on the gate electrode 13 are partly exposed by removing the first insulation film 15 from the bottom of the contact hole 23 so that the surface area above the third insuation film 22 may be stepped depending on the existence of the first insulation film 15. Consequently, the contact hole 23 for the lower capacitor electrode 19 becomes automatically aligned with the gate electrode 13 of the MOS transistor. If the uppermost first insulation film layer 15 is thicker than the lowermost first insulation film 15, the uppermost first insulation film layer 15 will partly remain unremoved when the lowermost insulation film layer 15 is completely removed from the bottom of the contact hole 23. While care should be taken not to expose the gate electrode 13 during and after this etching process, the third insulation film 22 on the gate electrode 13 acts as an etching barrier after the first insulation film 15 is completely removed from a part of the upper surface of the third insulation film 22 located on the gate electrode 13. If, on the other hand, the uppermost first insulation film layer 15 has a thickness equal to or smaller than that of the lowermost first insulation film 15, all the uppermost first insulation film layer 15 will be completely removed by the etching, although this would not give rise to any problem.

The process of forming the lower capacitor electrode 19 and all the following processes will be conducted similarly as those for the first embodiment of the stacked capacitor cell structure of the invention. More specifically, another polysilicon film is deposited on the entire surface area of the substrate so that it comes into contact with either of the source/drain diffusion layers 14 of the MOS transistor at the bottom of the contact hole 23. Note that the stepped area formed above the gate electrode 13 of the MOS transistor by the first insulation film 15 remaining on the third insulation film 22 serves to enlarge the surface of the lower capacitor electrode 19. After patterning the polysilicon film to form a lower capacitor electrode 19, still another polysilicon film is formed on the lower capacitor electrode 19 with the interposition of a capacitor gate insulation film 20 for an upper capacitor electrode 21.

While the above described second embodiment of the stacked capacitor cell structure of the present invention has advantages similar to those of the first embodiment, it is particularly suitable for large scale integration because the distance between the different portions of the gate electrode 13 of the MOS transistor can be minimized as the contact hole for the lower capacitor electrode 19 is automatically aligned with the gate electrode 13.

It should be noted that in the process of producing each of the above embodiments of the stacked capacitor cell structure and when only the second insulation films 16 are partly removed from the periphery of the contact hole 18 or 23, cavities can be, if viewed from above, coaxially formed and expanded to such an extent that those of the adjacent memory cells can eventually be connected together in the direction along the word lines so that, when polysilicon films are deposited for lower capacitor electrodes 19, there may arise a risk of formation of mutually connected capacitor electrodes.

A third embodiment of the stacked capacitor cell structure as illustrated in FIG. 4E is proposed to avoid this problem. FIGS. 4A through 4E illustrate the process of manufacturing this third embodiment. When compared with the preceding embodiments of the stacked capacitor cell structures, this embodiment differs from them in that it comprises two or more than two stacks of MIM capacitor (each constituted by a first insulation film 15, a lower capacitor electrode 19, a capacitor gate insulation film 20, an upper capacitor electrode 21, another capacitor gate insulation film 20 and an extension of the lower capacitor electrode 19 arranged in layers) and still another first insulation film 15 is additionally arranged to surround the outer periphery of the lower capacitor electrode 19 in such a manner that it is connected to the upper surface of the lowest first insulation film 15 and the outer periphery of the first insulation film layers 15 except the lowest one. All the remaining parts of this embodiment are similar to those of the first or second embodiment and therefore indicated by same reference numerals as those of the first embodiment in FIG. 2H.

Now, the process of manufacturing a stacked capacitor cell structure having such as configuration will be described below.

As shown in FIG. 4A, a MOS transistor is formed on a silicon substrate as a transfer gate and an inter-layer insulation film 31 is formed thereon. Then, the area of the inter-layer insulation film 31 that covers either of the source/drain diffusion layers 14 of the MOS transistor is removed. Thereafter, a lowermost first insulation film 15 and at least a stack (two stacks in this embodiment) 17 having a lower insulation film layer 16 and an upper insulation film layer 15 are formed thereon.

Then, as shown in FIG. 4B, the stacks 17 is processed for patterning so that it shows a profile that substantially corresponds to the planar pattern of a stacked capacitor.

Thereafter, as shown in FIG. 4C, an additional first insulation film 15 is formed to surround the outer periphery of the stacks 17 in such a manner that it is connected to the upper surface of the lowest first insulation film 15 and the outer periphery of the first insulation film layers 15 except the lowest one and arranged around the outer periphery of the second insulation film layers 16.

Then, as shown in FIG. 4D, a contact hole 18 for lower capacitor electrodes (storage node electrodes) is bored through the two-layered films 17 and the first insulation film 15 on either of the source/drain diffusion layers 14 of the MOS transistor. Then, only the second insulation film layers 16 are partly removed from the periphery of the contact hole 18 to form recesses by using an etching agent such as HF that reacts only with the material of the second insulation film layer. Since the first insulation films 15 are not affected by the agent, the contact hole 18 will come to show a fin-shaped jaggy profile.

Then, as shown in FIG. 4E, a layer of polysilicon is formed on the substrate carrying film layers thereon to completely cover the substrate so that the polysilicon comes to directly contact with either of the source/drain diffusion layers 14 of the MOS transistor under the contact hole 18. It should be noted that the polysilicon layer is also formed on the surfaces of the first insulation films 15 that have been exposed to the contact hole 18 or that the inner surface of the contact hole 18 is coated with a fin-shaped jagged polysilicon layer. A lower capacitor electrode 19 is obtained by patterning the polysilicon film layer. Then, a capacitor gate insulation film 20 is formed on the lower capacitor electrode 20.

Thereafter, another polysilicon film layer is formed on the entire surface area of the substrate to provide an upper capacitor electrode 21.

Figure 5:
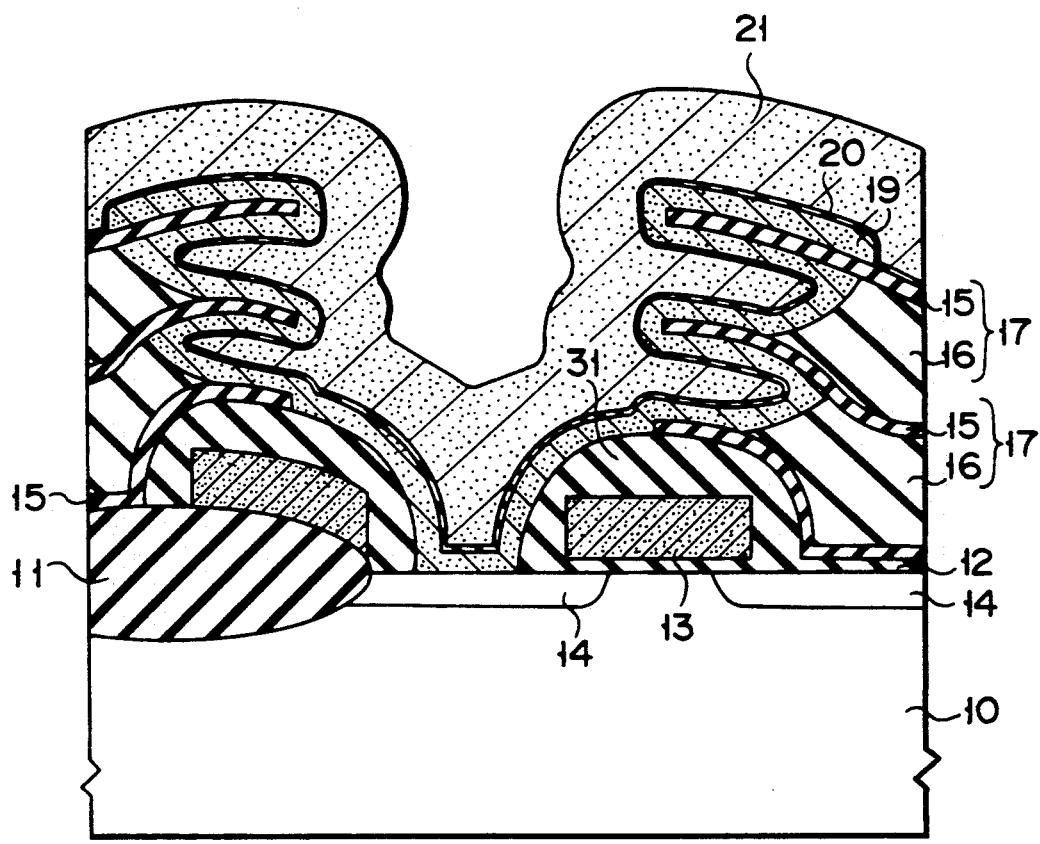
FIG. 5 is a sectional view of a modified stacked capacitor cell structure of FIG. 3H.

FIG. 5 illustrates a stacked capacitor cell structure obtained by modifying that of FIG. 3H, where an insuation film 31 is formed on the MOS transistor by using an appropriate technique such as CVD and the area of the insulation film 31 that covers either of the source/drain diffusion layers 14 of the MOS transistor is removed to provide a stacked capacitor cell structure similar to that of the second embodiment. In FIG. 5, those parts which are similar to their counterparts of the second embodiment are indicated by identical reference numerals as in FIG. 3H.

As is apparent from the above detailed description, the surface area of the lower capacitor electrode of a stacked capacitor cell structure according to the invention can be made large enough to provide a sufficient capacity of the capacitor. Moreover, short-circuited lower capacitor electrodes can be effectively avoided so that a semiconductor memory device particularly suitable for large scale integration can be manufactured without problem.

In the above embodiments, the capacitor gate insulation film 20 typically comprises a silicon nitride layer formed on the lower capacitor electrode 19 and a silicon oxide layer superposed on the silicon nitride layer. However, the capacitor gate insulation film 20 is not limited thereto. For example, the insulation film 20 may have a superposed-layer structure including at least a tantalum oxide layer. In such a case, the lower capacitor electrode 19 and the upper capacitor electrode 21 each preferably comprise a layer of refractory metal or high melting point metal such as tungsten.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:
a semiconductor body;
a field effect transistor comprising source and drain regions in said semiconductor body, a first insulating film on a channel region defined by said source and drain regions, and a gate electrode on said first insulating film;
a second insulating film on said gate electrode and said source and drain regions;
a third insulating film on said second insulating film;
a fourth insulating film on said third insulating film;
an opening through said second, third, and fourth insulating films and exposing one of said source and drain regions;
grooves in sidewalls of said opening;
a first conductive layer on exposed surface portions of said opening including said one of said source and drain regions and of said grooves defining a first electrode;
a fifth insulating film on said first conductive layer; and
a second conductive layer on said fifth insulating film defining a second electrode,
whereby said first and second electrodes and said fifth insulating film form a capacitor.

2. The semiconductor memory device according to claim 1, wherein said grooves are in said third insulating film.

3. The semiconductor memory device according to claim 1, wherein said second and fourth insulating films have a substantially same composition.

4. The semiconductor memory device according to claim 1, wherein said second insulating film comprises a silicon nitride film.

5. The semiconductor memory device according to claim 1, wherein said third insulating film comprises one material of a group consisting of silicon oxide, boron-phosphorus-silicate glass (BPSG) and phosphorus-silicate-glass (PSG).

6. The semiconductor memory device according to claim 1, wherein said fourth insulating film comprises a silicon nitride film.

7. A semiconductor memory device, comprising:
a semiconductor body;
a field effect transistor comprising source and drain regions in said semiconductor body, a first insulating film on a channel region defined by said source and drain regions, and a gate electrode on said first insulating film;
a second insulating film on said gate electrode and said source and drain regions;
at least one composite insulating layer on said second insulating film, each composite insulating layer comprising first and second insulating films;
an opening through said second and said at least one composite insulating films and exposing one of said source and drain regions;
grooves in sidewalls of said opening;
a first conductive layer on exposed surface portions of said opening including said one of said source and drain regions and of said grooves defining a first electrode;
a fifth insulating film on said first conductive layer; and
a second conductive layer on said fifth insulating film defining a second electrode,
whereby said first and second electrodes and said fifth insulating film form a capacitor.

8. The semiconductor memory device according to claim 7, wherein said grooves are in said first insulating films of each of said composite insulating layers.

9. The semiconductor memory device according to claim 7, wherein said second insulating film on said gate electrode and said second insulating film of each composite insulating layer have a substantially same composition.

10. The semiconductor memory device according to claim 7, wherein said grooves are in the first insulating films of said at least one composite insulating layer.

11. The semiconductor memory device according to claim 7, wherein a portion of said first conductive layer is on an upper surface of said second insulating film of a topmost composite insulating layer.

12. A semiconductor memory device, comprising:
a semiconductor body;
a field effect transistor comprising source and drain regions in said semiconductor body, a first insulating film on a channel region defined by said source and drain regions, and a gate electrode on said first insulating film;
a second insulating film on an upper surface of said gate electrode;
a third insulating film on said second insulating film and said source and drain regions;
a fourth insulating film on said third insulating film;
a fifth insulating film on said fourth insulating film;
an opening through said third, fourth and fifth insulating films and exposing one of said source and drain regions and a portion of said second insulating film;
grooves in sidewalls of said opening;
a first conductive layer on exposed surface portions of said opening including said one of said source and drain regions and on an upper surface of said second insulating film and of said grooves defining a first electrode;
a sixth insulating film on said first conductive layer; and
a second conductive layer on said sixth insulating film defining a second electrode,
whereby said first and second electrodes and said sixth insulating film form a capacitor.

13. The semiconductor memory device according to claim 12, wherein said grooves are in said fourth insulation film.

14. The semiconductor memory device according to claim 12, wherein said third and fifth insulation films have a substantially same composition.

15. A semiconductor memory device, comprising:
a semiconductor body;
a field effect transistor comprising source and drain regions in said semiconductor body, a first insulating film on a channel region defined by said source and drain regions, and a gate electrode on said first insulating film;
a second insulating film on said gate electrode and said source and drain regions;
a third insulating film on said second insulating film;
a fourth insulating film on outer side surfaces of said second and third insulating films and an upper surface of said third insulating film;
an opening through said second, third, and fourth insulating films and exposing one of said source and drain regions;
grooves in sidewalls of said opening;
a first conductive layer on exposed surface portions of said opening including said one of said source and drain regions and of said grooves defining a first electrode;
a fifth insulating film on said first conductive layer; and
a second conductive layer on said fifth insulating film defining a second electrode,
whereby said first and second electrodes and said fifth insulating film form a capacitor.

16. The semiconductor memory device according to claim 15, wherein said grooves are in said third insulation film.

17. The semiconductor memory device according to claim 15, wherein said second, third, and fourth insulation films have a substantially same composition.

* * * * *